United States Patent [19]

Wong

[11] Patent Number: 4,634,904

[45] Date of Patent: Jan. 6, 1987

[54] CMOS POWER-ON RESET CIRCUIT

[75] Inventor: Anthony Y. Wong, Cupertino, Calif.

[73] Assignee: LSI Logic Corporation, Milpitas, Calif.

[21] Appl. No.: 719,285

[22] Filed: Apr. 3, 1985

[51] Int. Cl.[4] .......................................... H03K 17/22
[52] U.S. Cl. ........................ 307/594; 307/200 B; 307/363; 307/272 R; 307/585; 307/591; 307/601; 307/603; 307/605
[58] Field of Search ............... 307/200 A, 200 B, 448, 307/246, 362–363, 579–581, 584–585, 590–594, 601, 603, 605, 608, 272 R, 303, 320

[56] References Cited

U.S. PATENT DOCUMENTS

| | | | |
|---|---|---|---|
| 3,894,247 | 7/1975 | De Jong | 307/592 |
| 3,895,239 | 7/1975 | Alaspa | 307/268 |
| 3,950,654 | 4/1976 | Broedner et al. | 307/592 X |
| 4,001,609 | 1/1977 | Sickert | 307/268 |
| 4,013,902 | 3/1977 | Payne | 307/268 |
| 4,045,688 | 8/1977 | Stewart | 307/200 B X |
| 4,103,187 | 7/1978 | Imamura | 307/200 B X |
| 4,140,930 | 2/1979 | Tanaka | 307/362 |
| 4,300,065 | 11/1981 | Remedi et al. | 307/571 |
| 4,385,245 | 5/1983 | Ulmer | 307/362 X |
| 4,405,871 | 9/1983 | Buurma et al. | 307/594 |
| 4,409,501 | 10/1983 | Eickerman et al. | 307/594 |
| 4,419,596 | 12/1983 | Kikuchi | 307/593 X |
| 4,558,233 | 12/1985 | Nakamori | 307/362 |

FOREIGN PATENT DOCUMENTS

| | | | |
|---|---|---|---|
| 0047727 | 4/1980 | Japan | 307/594 |
| 0048831 | 3/1982 | Japan | 307/594 |
| 0080928 | 5/1983 | Japan | 307/594 |

Primary Examiner—Stanley D. Miller
Assistant Examiner—D. R. Hudspeth

[57] ABSTRACT

A CMOS reset circuit has a reverse biased diode and a latch for latching a p-channel enhancement mode MOSFET on during the first part of the power-on cycle. The p-channel MOSFET is part of a voltage divider which also includes a resistor. When the voltage between p-channel MOSFET and resistor reach the threshold of an n-channel enhancement mode MOSFET, the p-channel MOSFET is switched off. Reset pulses are provided through one or two inverters by a load on the latch.

6 Claims, 2 Drawing Figures

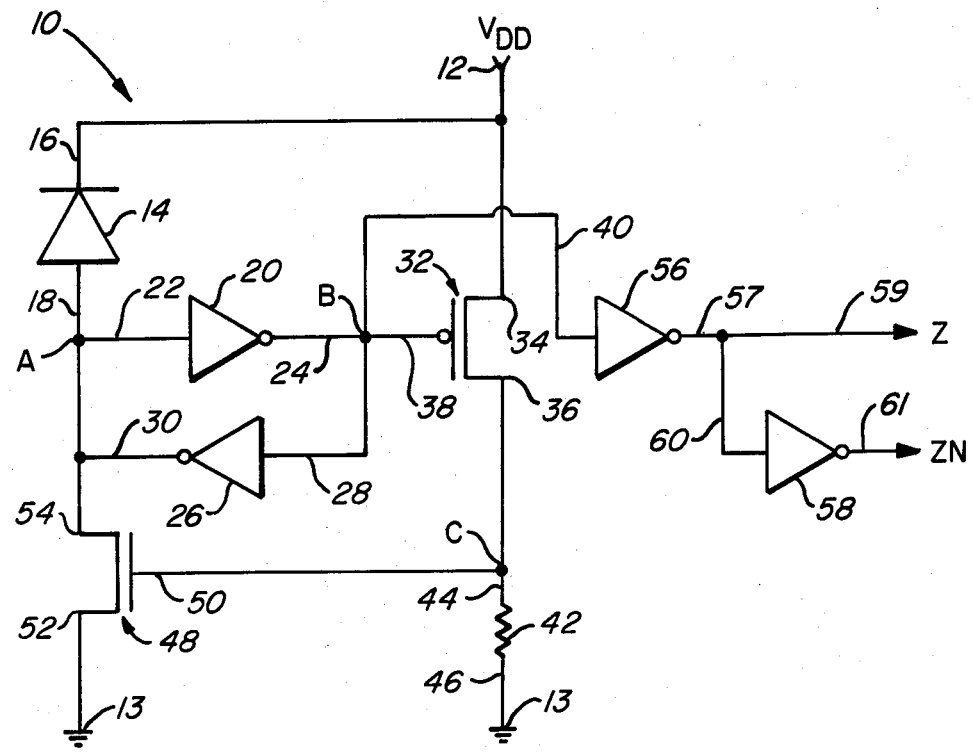
FIG._1.
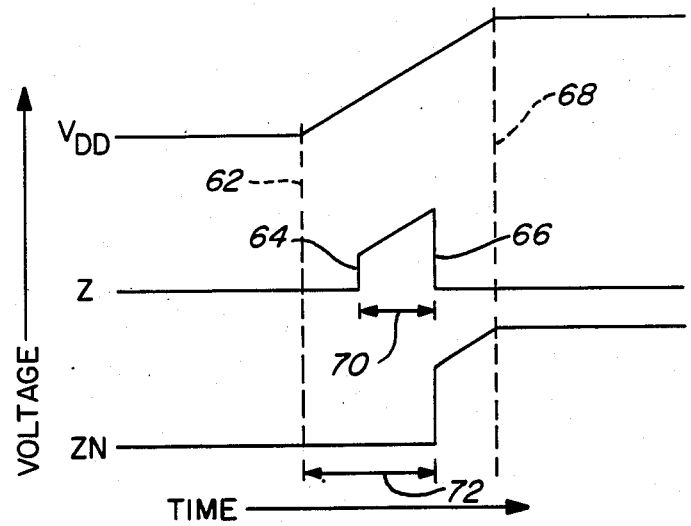
FIG._2.

CMOS POWER-ON RESET CIRCUIT

DESCRIPTION

1. Technical Field

The invention relates to semiconductor integrated circuits and in particular to a circuit which generates a reset pulse when a power supply for associated circuits is switched on.

2. Background Art

Some integrated circuits (ICs) are provided with a reset circuit which restores the IC's bistable elements to a prescribed initial state. It is particularly important to reset an IC when the power supply is switched on, because the states of its elements are initially undefined when the power is switched on. A class of circuits, known as power-on reset circuits, generate a reset pulse to reset an IC when the power supply is switched on.

Prior reset circuits have used resistor-capacitor (RC) components to generate a reset pulse. Some circuits consume power even in a steady state. Other circuits require special transistor sizes. Further, some IC's using these reset circuits require an extra external pin.

Many integrated circuits are made using gate arrays, a geometric pattern of basic gates contained in one chip. The gates are interconnected during manufacture according to the desired function. In this way, chips with many different complex functions can be made from a standard gate array chip without major redesign. The transistors can be any size, but in each array they are all the same size.

Reset circuits of the prior art that are integrated onto an IC chip cannot be used with gate arrays, because they must be adapted for each fixed transistor size. In addition, the reset circuits are desired that take up less space on a chip, yet still have some control over threshold voltages and pulse width.

It is an object of the invention to provide a simplified CMOS power-on reset circuit for generating a reset pulse which may be integrated into gate array circuits of any transistor size.

It is another object of the invention to provide a reset circuit which generates a pulse independent of power supply rise time and which does not consume power in the steady state.

DISCLOSURE OF THE INVENTION

The above objects have been met with a CMOS power-on reset circuit in which the depletion layer capacitance of a reverse biased diode is used with an inverter to latch open a voltage divider until the supply voltage reaches the threshold voltage of a n-channel FET. The reset pulse is output from the inverter, and may first go through a buffer/inverter to increase the output drive capability.

An advantage of the circuit is that it is simple and may be integrated into gate array circuits. It does not consume power in the steady state, because a voltage divider which includes a p-channel FET is latched shut when the n-channel FET reaches threshold while the reverse bias of the diode prevents current flow along the alternate path. The circuit may be fabricated using gate array transistors of the same size as gate array cell transistors.

BRIEF DESCRIPTION OF THE DRAWINGS

FIG. 1 is a schematic diagram of the circuit of the present invention.

FIG. 2 is a timing diagram of signals found in the circuit of FIG. 1.

BEST MODE FOR CARRYING OUT THE INVENTION

With reference to FIG. 1, a reset circuit 10 is responsive to a supply voltage between a supply terminal 12 and a ground terminal 13 to generate a first reset pulse Z and a second reset pulse ZN. A p-n diode 14 has a cathode 16 and an anode 18. Cathode 16 is connected to supply terminal 12. The diode is in reverse bias relationship to a positive supply voltage from supply terminal 12.

A first inverter 20 has an input 22 and an output 24. Input 22 is connected to the anode 18 at a node A. A second inverter 26 has an input 28 and an output 30. Input 28 of second inverter 26 is connected to output 24 of first inverter 20 at a node B. Output 30 of second inverter 26 is in turn connected at node A to input 22 of first inverter 20 and to anode 18 of diode 14.

A p-channel enhancement mode MOS field-effect-transistor (MOSFET) 32 has a source 34, a drain 36, and a gate 38. Source 34 is connected to supply terminal 12. Gate 38 is connected at node B to output 24 of first inverter 20 and input 28 of second inverter 26.

A resistor 42 has a first electrode 44 connected to drain 36 of p-channel MOSFET 32 to form a node C. Resistor 42 also has a second electrode 46 connected to ground terminal 13. Resistor 42 is typically a polygate resistor.

An n-channel enhancement mode MOSFET 48 has a gate 50, source 52, and drain 54. Gate 50 is connected at node C to first electrode 44 of resistor 42 and to drain 36 of p-channel MOSFET 32. Source 52 is connected to ground terminal 13. Drain 54 is connected at node A to anode 18 of diode 14, input 22 of first inverter 20 and output 30 of second inverter 26.

A third inverter 56 has an input 40, which is the load of inverter 20 connected to gate 38, and an output 57 that leads to terminal 59 for providing a pulse Z, which is the first reset pulse of the circuit. A fourth inverter 58 has an input 60 connected to output 57 of third inverter 56. Fourth inverter 58 has an output terminal 61 for providing a pulse ZN, which is the second output of the circuit.

Inverters 20, 26, 56 and 58 are typically CMOS inverters. CMOS inverters have a p-channel MOSFET and an n-channel MOSFET. The gates of both MOSFETS are connected to form an input. The source of the p-channel MOSFET is connected to supply terminal 12. The drain of the p-channel MOSFET is connected to the drain of the n-channel MOSFET to form an output. The source of the n-channel MOSFET is connected to ground terminal 13. Each of the circuit elements may be part of a gate array transistor array. The inverters 20, 26, 56 and 58 may each be made of a pair of identical size transistors in the transistor array. Likewise, p-channel MOSFET 32 and n-channel MOSFET 48 may be gate array transistors. Diode 14 may be formed from two electrodes of a gate array transistor. Resistor 42 may be a polygate resistor, i.e., a resistor formed from a plurality of transistors in the array connected in series.

In operation, when the power supply 12 is switched on, supply voltage $V_{DD}$ usually takes about 4 milliseconds to reach its final value. In this transition, supply voltage $V_{DD}$ increases linearly at a constant rate. p-n diode 14 responds to an incremental reverse bias in a manner that results in generation of an effective capacitance, called depletion-layer capacitance. Because of this capacitance, node A is effectively coupled to supply terminal 12 during the transition period.

Inverters 20 and 26 together make up a latch. When the voltage at node A, which is coupled through the capacitance of diode 14 to supply voltage $V_{DD}$, reaches the threshold of inverter 20, node B is at ground potential. When the voltage at gate 38 is ground, p-channel transistor 32 is on, and when the voltage at gate 38 is above threshold of transistor 32, transistor 32 is off. So, when node B becomes tied to ground, transistor 32 is turned on, effectively coupling node C through drain 36 and source 34 to supply terminal 12.

Transistor 32 and resistor 42 form a voltage divider. When transistor 32 is on, the voltage at node C rises proportionally to supply voltage $V_{DD}$ at supply terminal 12. N-channel MOSFET 48 is an enhancement-mode transistor that is used as a threshold detector. When the voltage at node C reaches the threshold of transistor 48, transistor 48 is turned on, effectively grounding node A. With node A at ground potential, node B has voltage $V_{DD}$. Transistor 32 is shut off. The voltage at node C returns to ground potential, shutting off transistor 48 and completing the operating cycle.

Load 40 of inverter 20 feeds into inverter 56 to provide a first circuit output pulse Z at terminal 59, called the active high reset pulse. This in turn feeds into inverter 58 to provide a second circuit output pulse ZN at terminal 61 called the active low reset pulse. Either of the two reset pulse outputs can be used.

With reference to FIG. 2, when the power supply is turned on, supply voltage $V_{DD}$ usually takes about four milliseconds to reach its final value of about five volts at 68. The circuit does not operate until $V_{DD}$ reaches approximately 0.8 volt, which is the operating voltage of the circuit elements at 64. During this period when supply voltage $V_{DD}$ is below the operating voltage, the outputs Z and ZN are at zero voltage. As soon as supply voltage $V_{DD}$ reaches the operating voltage at 64, node B is grounded and transistor 32 is switched on. The voltage on inverter input 40 is the same as that of node B, i.e., ground voltage, so output Z at terminal 59 has voltage $V_{DD}$ and the output ZN at terminal 61 is at ground voltage. As soon as the voltage at node C reaches the threshold voltage of transistor 48 at 66, node A is grounded, node B has voltage $V_{DD}$, and transistor 32 is switched off. The voltage of the output Z at terminal 59 drops to ground voltage, while the voltage of the output ZN at terminal 61 switches to $V_{DD}$. Pulse Z has a resulting pulse width 70, while pulse ZN has a pulse width 72. Thus one operating cycle is completed.

I claim:
1. A power-on reset circuit comprising,
   a capacitance means having a first electrode connected to a power supply and a second electrode, said capacitance means for capacitively coupling said second electrode to said power supply when said power supply is switched on,
   a latch means having a first terminal connected to said second electrode of said capacitance means and a second terminal, said latch means for grounding said second terminal of the latch means when said first terminial of the latch means is coupled to said power supply and coupling said second terminal of the latch means to said power supply when said first terminal of the latch means is at ground potential,
   a voltage divider means having an input connected to said power supply, a first output, a ground reference terminal and control means, said control means connected to said second terminal of said latch means for resistively coupling said first output to said input when said second terminal of the latch means is at ground potential at said ground reference terminal,
   a threshold detection means connected to said first output of said voltage divider means and connected to said first terminal of said latch means for grounding said first terminal of said latch means when said first output of said voltage divider means reaches a voltage threshold, and
   an output means connected to said second terminal of said latch means for generating at least one output of the circuit.

2. A CMOS integrated power-on reset circuit, responsive to the application of a supply voltage across a supply terminal and a ground terminal, the circuit comprising,
   a p-n diode having an anode and a cathode coupled to a supply terminal,
   a first inverter having an input coupled to said anode of said diode to form a first node, and providing an output,
   a second inverter having an input coupled to said output of said first inverter to form a second node, said second inverter also providing an output coupled to said first node,
   a p-channel transistor having a source coupled to said supply terminal, a drain, and a gate coupled to said second node,
   a resistor having a first electrode coupled to said drain of said p-channel transistor to form a third node and a second electrode coupled to said ground terminal,
   an n-channel transistor having a gate coupled to said third node, a drain coupled to said first node, and a source coupled to said ground terminal, and
   a third inverter having an input coupled to said second node and providing an output which is a first output of the circuit.

3. The circuit of claim 2 further comprising a fourth inverter having an input coupled to said output of said third inverter and providing a second output of the circuit.

4. The circuit of claim 2 wherein said p-channel transistor, said n-channel transistor and said first and second CMOS inverters all comprise transistors of the same size in a CMOS gate array.

5. In a CMOS gate array transistor array, a power-on reset circuit responsive to the application of a supply voltage across a supply terminal and a ground terminal,
   a p-n diode having an anode and a cathode connected to a supply terminal,
   a first CMOS inverter formed from a pair of transistors in a gate array transistor array, having an input connected to said anode of said diode to form a first node, and providing an output,
   a second CMOS inverter formed from a pair of transistors in said gate array transistor array, said inverter having an input connected to said output of said first inverter to form a second node, said second inverter also providing an output connected to said first node, a p-channel enhancement mode MOSFET having a source connected to said supply terminal, a drain, and a gate connected to said second node, said p-channel MOSFET being a transistor in said gate array transistor array, a resistor having a first electrode connected to said drain of said p-channel MOSFET to form a third node and a second electrode connected to a ground terminal, an n-channel enhancement mode MOSFET having a gate connected to said third node, a drain connected to said first node, and a source connected to said ground terminal, said n-channel MOSFET being a transistor in said gate array transistor array, and a third CMOS inverter formed from a pair of transistors in said gate array transistor array, said inverter having an input connected to said second node and providing an output which is a first output of the circuit.

6. The circuit of claim 5 further comprising a fourth CMOS inverter formed from a pair of transistors in said gate array transistor array, said inverter having an input connected to said output of said third inverter and providing a second output of the circuit.

* * * * *